(12) United States Patent
Sohn

(10) Patent No.: US 6,967,142 B2
(45) Date of Patent: Nov. 22, 2005

(54) SEMICONDUCTOR DEVICES AND METHODS OF MANUFACTURING THE SAME

(75) Inventor: Hyun Joon Sohn, Seoul (KR)

(73) Assignee: DongbuAnam Semiconductor, Inc., Seoul (KR)

(*) Notice: Subject to any disclaimer, the term of this patent is extended or adjusted under 35 U.S.C. 154(b) by 86 days.

(21) Appl. No.: 10/722,825

(22) Filed: Nov. 26, 2003

(65) Prior Publication Data

US 2004/0126936 A1  Jul. 1, 2004

(30) Foreign Application Priority Data

Dec. 30, 2002  (KR) ................ 10-2002-0087367

(51) Int. Cl.[7] ............................................. H01L 21/76
(52) U.S. Cl. ...................................... 438/296; 438/424
(58) Field of Search ................................ 438/296, 424, 438/430

(56) References Cited

U.S. PATENT DOCUMENTS 6,281,082 B1 * 8/2001 Chen et al. ................ 438/296

* cited by examiner

Primary Examiner—Asok Kumar Sarkar
(74) Attorney, Agent, or Firm—Hanley, Flight & Zimmerman LLC

(57) ABSTRACT

An example method for fabricating a semiconductor device includes forming a well, a source region, and a drain region in a substrate, forming a gate oxide film on the substrate and coating a polysilicon film on the gate oxide film. Further, the example method includes forming a trench isolation in the substrate by a dry etching process, forming a oxide film on the inside surface of the trench isolation, providing a dielectric material to fill in the trench isolation, planarizing the dielectric material to expose the top surface of the polysilicon film, and forming a gate by dry etching the polysilicon film.

4 Claims, 5 Drawing Sheets

SEMICONDUCTOR DEVICES AND METHODS OF MANUFACTURING THE SAME

TECHNICAL FIELD

The present disclosure relates to semiconductors and, more particularly, to semiconductor devices and methods of manufacturing the same.

BACKGROUND

Recently, as semiconductor devices have become highly integrated, it is desirable to have excellent characteristics in a small area in processes for isolating unit elements. This requires a decrease in the number of defects, the use of a good quality gate oxide film, and a development of techniques for isolating the element.

FIGS. 1A to 1D illustrate cross sectional views sequentially showing a conventional process of fabricating a semiconductor device. As shown in the drawings, after a hard mask material is coated on a wafer 10 to form a hard mask layer 11, a photoresist pattern 12 is formed on the hard mask layer 11. Following the application of the photoresist pattern 12, a mask for forming a trench isolation is formed by a dry etching process.

Next, the photoresist pattern 12 is removed, and a trench isolation 14 is formed by another dry etching process. Thereafter, an oxide film (not shown) is coated on the inside surface of the trench by an oxide film forming process.

The trench is then filled with a dielectric material, wherein the oxide film is coated thereon. By a Chemical Mechanical Polishing (CMP) process, an upper part of the dielectric material and the hard mask layer 11 are planarized until the hard mask layer 11 is removed. A cleaning process is then performed to eliminate entirely any hard mask material remaining on the wafer. Then, a well 17, a source region 15 and a drain region 16 are formed by a photoresist process and an ion implantation process, and finally a gate oxide film is formed. At this time, by many processes performed previously, especially the cleaning process, a divot 19 is generated.

After a polysilicon layer is coated on the entire wafer, a gate 21 is formed by a photoresist process and a dry etching process.

However, in such fabricating method described above, a poly residue or poly stringer 20 is produced due to the divot 19. The presence of the poly stringer 20 deteriorates the operational characteristics and reliability of the semiconductor device.

DETAILED DESCRIPTION

Figure 1A:
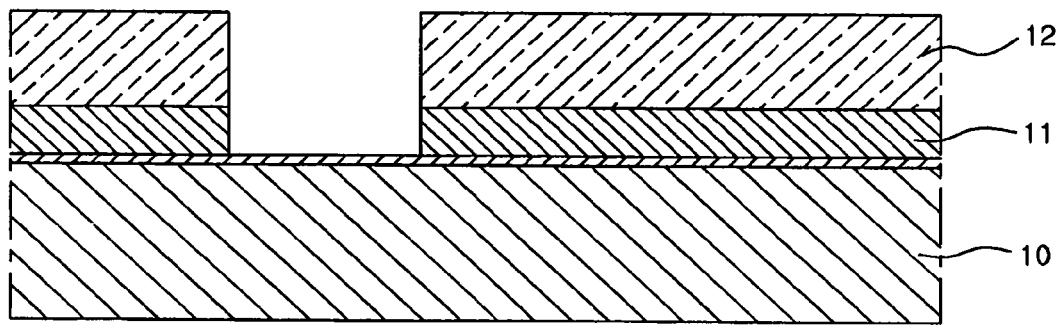
FIGS. 1A to 1D illustrate cross sectional views sequentially showing a conventional method of fabricating a semiconductor device.
Figure 1B:
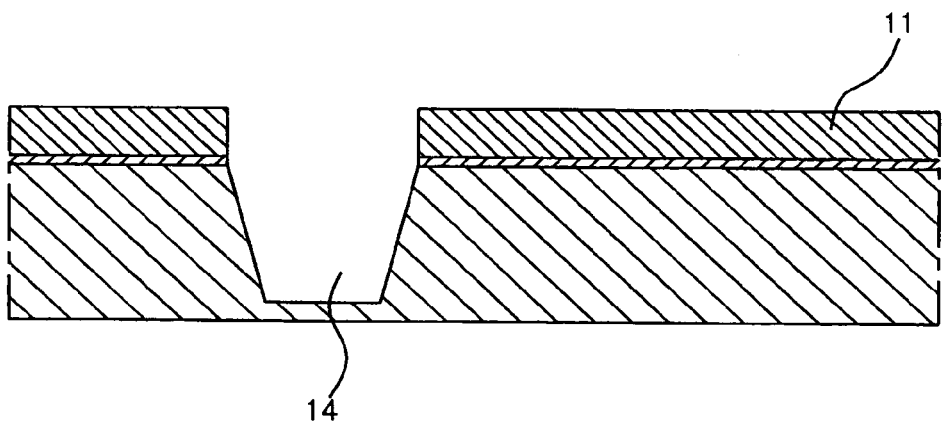
Figure 1C:
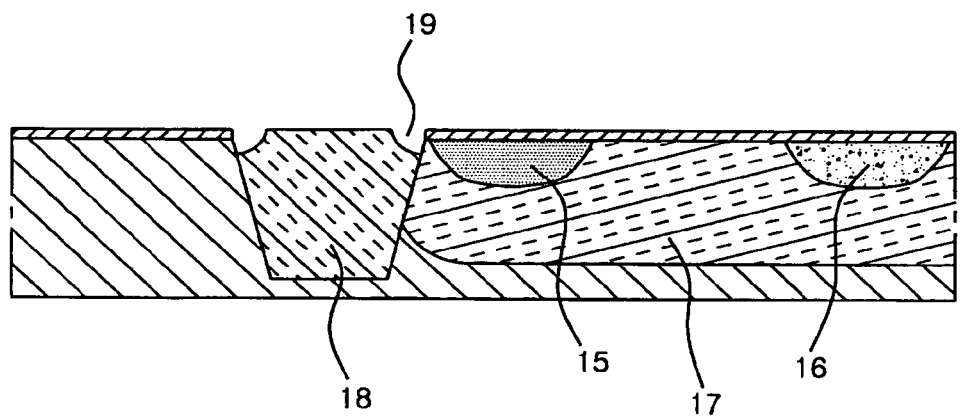
Figure 1D:
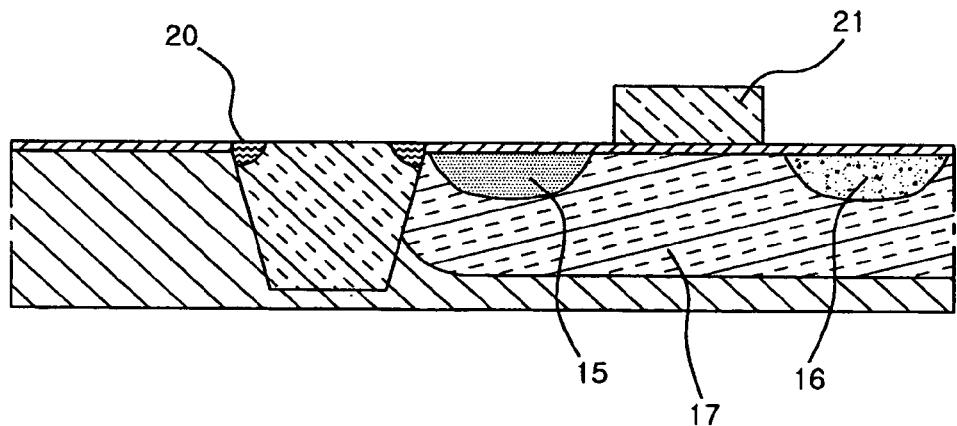

Examples of the disclosed methods and devices will now be described in detail with reference to the accompanying drawings, wherein like reference numerals appearing in the drawings represent like parts.

Figure 2A:
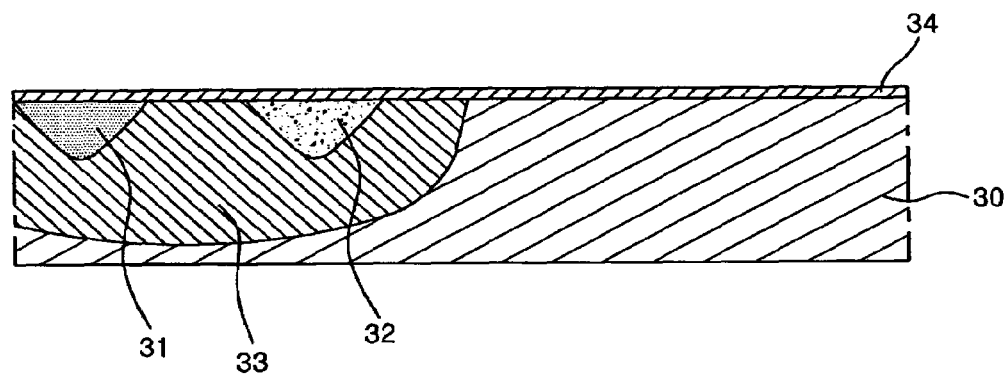
FIGS. 2A to 2E depict cross sectional views sequentially showing a example method of fabricating a semiconductor device in accordance with one example disclosed herein.

As shown in FIGS. 2A to 2E, a source region 31, a drain region 32, and a well 33 are formed in a semiconductor wafer 30 by a photoresist process and an ion implantation process. After a cleaning process is performed, a gate oxide film 34 is formed on the wafer 30 (FIG. 2A).

Figure 2B:
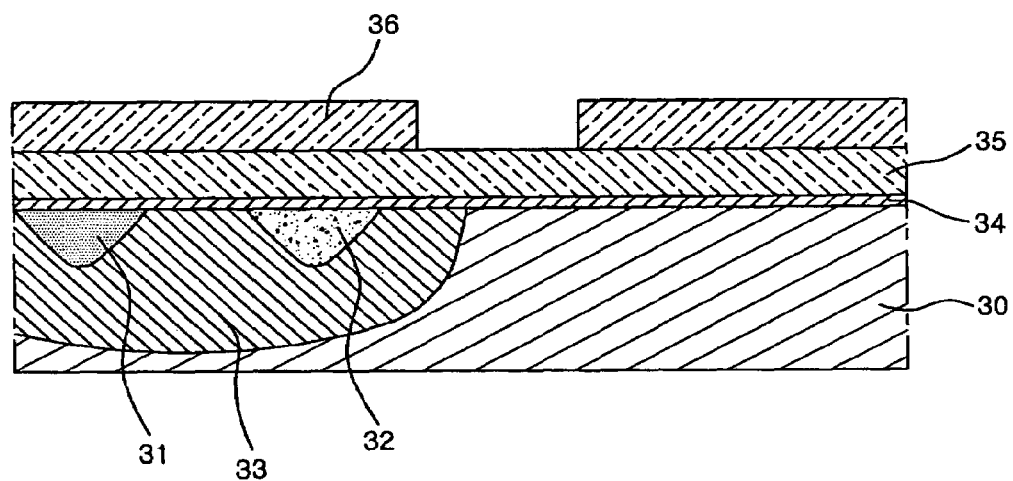

A polysilicon film 35 is coated on the gate oxide film 34 and a first photoresist pattern 36 for forming a trench is formed on the polysilicon film 35 (FIG. 2B).

Figure 2C:
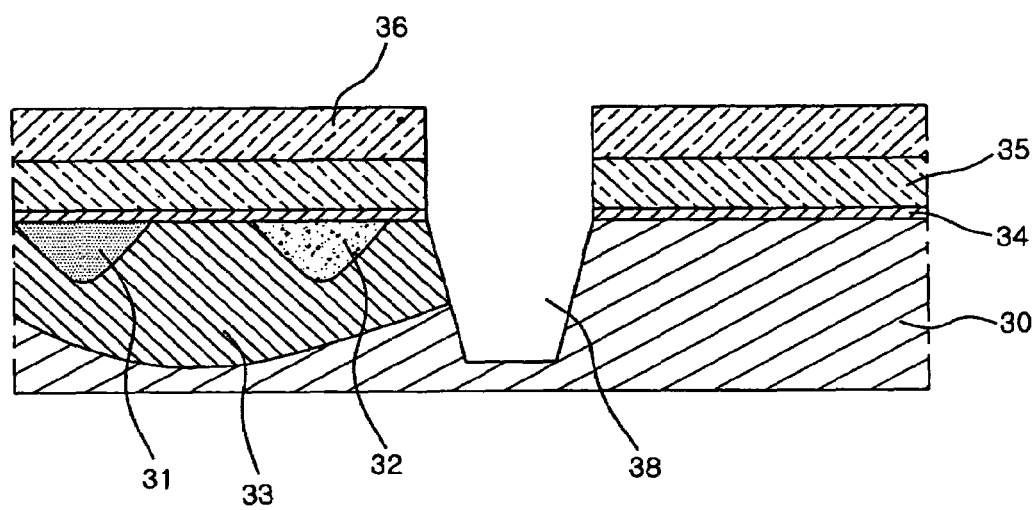

A trench isolation 38 may be formed in the wafer 30 by a dry etching process using the photoresist pattern 36 as a mask (FIG. 2C).

Figure 2D:
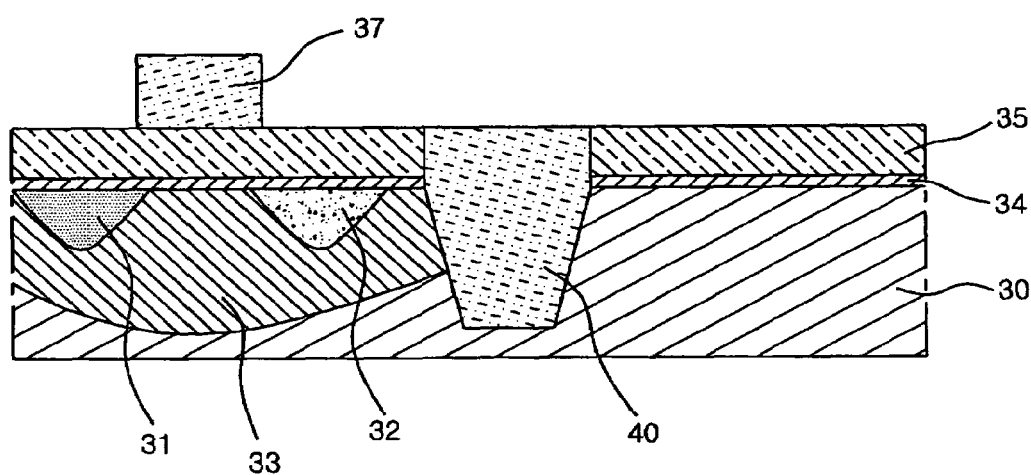

An oxide film is coated on the inside surface of the trench isolation 38, and a dielectric material 40 is provided to fill in the trench isolation 38. The dielectric material 40 is then planarized to expose the top surface of the polysilicon film 35 by a CMP process (FIG. 2D).

Figure 2E:
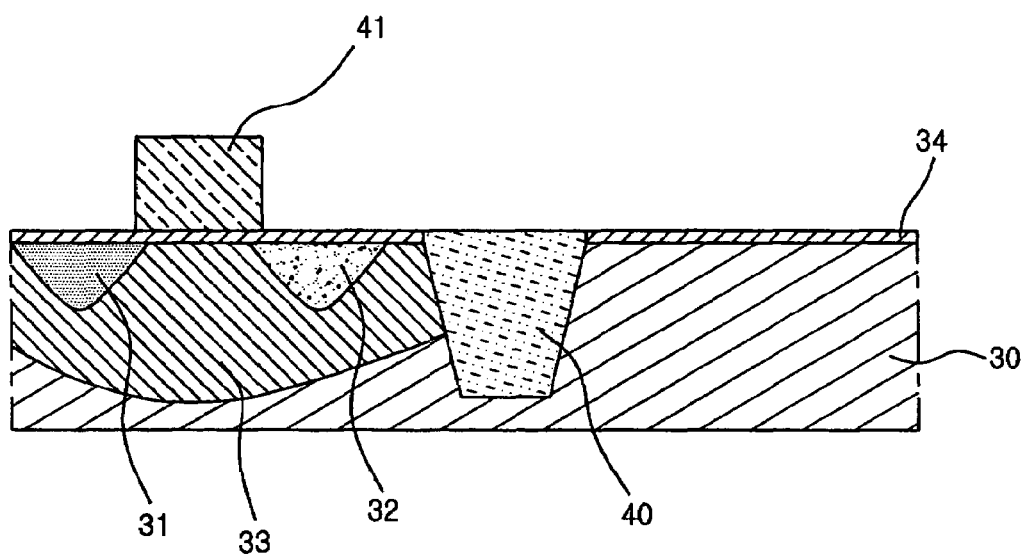

A second photoresist pattern 37 is formed on the polysilicon film 35 by a photoresist process and a gate 41 is formed by dry etching the polysilicon film 35 using the second photoresist pattern 37 as a mask (FIG. 2E).

The gate 41 is formed by a two-step dry etching process including a first etching process without any selective ratio to the dielectric material, and a second etching process with a selective ratio to the dielectric material; and, therefore, the dielectric material 40 in the trench isolation 38 is not protruded from the gate oxide film 34.

According to the disclosed example methods described above, there is provided a semiconductor device including the well 33, the source region 31 and the drain region 32 formed in the semiconductor wafer 30, the gate oxide film 34 formed on the wafer, the gate 41 formed on the gate oxide film, and the trench isolation 38 in which the dielectric material is filled.

According to the present disclosure, the number of processes before the formation of the gate oxide film 34 is reduced and, therefore, a pitting phenomenon of the wafer 30 due to wafer damages and defects is decreased, thereby improving a reliability of the gate oxide film 34 and electrical and operational characteristics of the device.

Further, no divot is formed at the edge of the trench so that a poly residue or poly stringer 20 is not produced, thereby increasing a reliability of the gate oxide film and decreasing defects to improve the operating characteristics of the semiconductor device.

Although certain apparatus and methods are disclosed herein, the scope of coverage of this patent is not limited thereto. On the contrary, this patent covers every apparatus, method, and article of manufacture fairly falling within the scope of the appended claims either literally or under the doctrine of equivalents.

What is claimed is:

1. A method for fabricating a semiconductor device comprising:

forming a well, a source region, and a drain region in a substrate;

forming a gate oxide film on the substrate;

depositing a polysilicon film on the gate oxide film;

forming a trench isolation in the substrate by a dry etching process;

forming an oxide film on the inside surface of the trench isolation;

providing a dielectric material to fill in the trench isolation and planarizing the dielectric material to expose the top surface of the polysilicon film; and forming a gate by dry etching the polysilicon film.

2. The method of claim 1, wherein forming a gate by dry etching the polysilicon film includes a first etching process without a selective ratio to the dielectric material and a second etching process with a selective ratio to the dielectric material, so that the dielectric material in the trench isolation is not protruded from the gate oxide film.

3. The method of claim 1, wherein in the trench isolation forming, the dry etching process is performed by using a photoresist pattern formed on the polysilicon film as a mask.

4. The method of claim 1, wherein the planarizing of the dielectric material is performed by a CMP process.

* * * * *